(12) United States Patent
Nakamura et al.

(10) Patent No.: US 7,524,004 B2
(45) Date of Patent: Apr. 28, 2009

(54) MOVABLE CONSOLE DEVICE

(75) Inventors: Akio Nakamura, Shinagawa (JP); Fujio Seki, Shinagawa (JP); Katsuya Funakoshi, Shinagawa (JP); Keiji Miyatsu, Shinagawa (JP)

(73) Assignee: Fujitsu Component Limited, Tokyo (JP)

( * ) Notice: Subject to any disclaimer, the term of this patent is extended or adjusted under 35 U.S.C. 154(b) by 70 days.

(21) Appl. No.: 11/394,280

(22) Filed: Mar. 31, 2006

(65) Prior Publication Data

US 2006/0220505 A1 Oct. 5, 2006

(30) Foreign Application Priority Data

Mar. 31, 2005 (JP) ............................. 2005-104050

(51) Int. Cl.
*A47B 81/00* (2006.01)
(52) U.S. Cl. ..................... 312/223.2; 361/727; 361/681
(58) Field of Classification Search ................. 361/727, 361/681; 312/223.2
See application file for complete search history.

(56) References Cited

U.S. PATENT DOCUMENTS

| | | | |
|---|---|---|---|
| 5,362,144 A * | 11/1994 | Shioya et al. ............ 312/319.6 |
| 6,168,250 B1 * | 1/2001 | Rogov ........................ 312/294 |
| 6,352,226 B1 * | 3/2002 | Gordon ................... 248/125.2 |
| 6,381,125 B1 * | 4/2002 | Mizoguchi et al. .......... 361/682 |
| 6,445,836 B1 * | 9/2002 | Fujiwara ..................... 382/312 |
| 6,945,412 B2 * | 9/2005 | Felcman et al. .............. 211/26 |
| 7,124,984 B2 * | 10/2006 | Yokouchi et al. ......... 248/125.8 |
| 7,256,986 B2 * | 8/2007 | Williams et al. ............ 361/683 |
| 2004/0125549 A1 * | 7/2004 | Iredale ....................... 361/681 |

FOREIGN PATENT DOCUMENTS

JP 2000-29565 1/2000

* cited by examiner

*Primary Examiner*—Lisa Lea-Edmonds
*Assistant Examiner*—Ingrid Wright
(74) *Attorney, Agent, or Firm*—Staas & Halsey LLP

(57) ABSTRACT

A movable console device having a rack-mount configuration. The movable console device is provided with a console section including a keyboard and a display, a mount section for mounting the console section onto a rack structure in a manner movable between a retracted position and a drawn-out position, and a drive section for automatically moving the console section with respect to the rack structure between the retracted and drawn-out positions. The console section includes a display support mechanism for supporting the display in a manner displaceable between a non-operating position and an operating position, and a second drive section is provided for automatically displacing the display between the non-operating and operating positions.

14 Claims, 12 Drawing Sheets

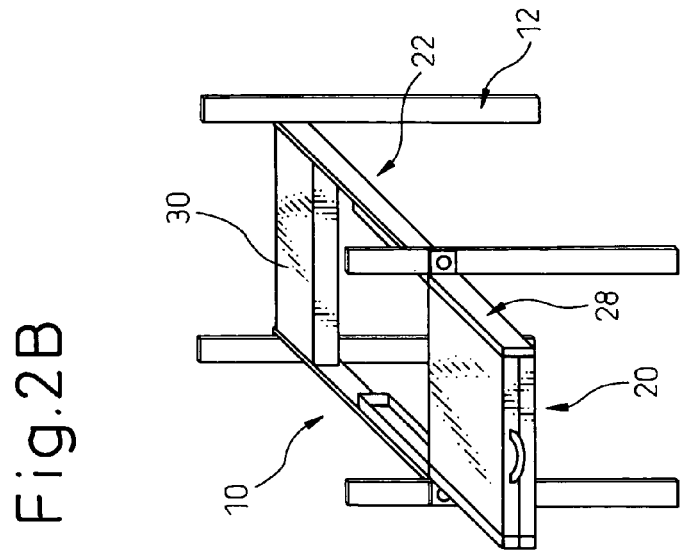
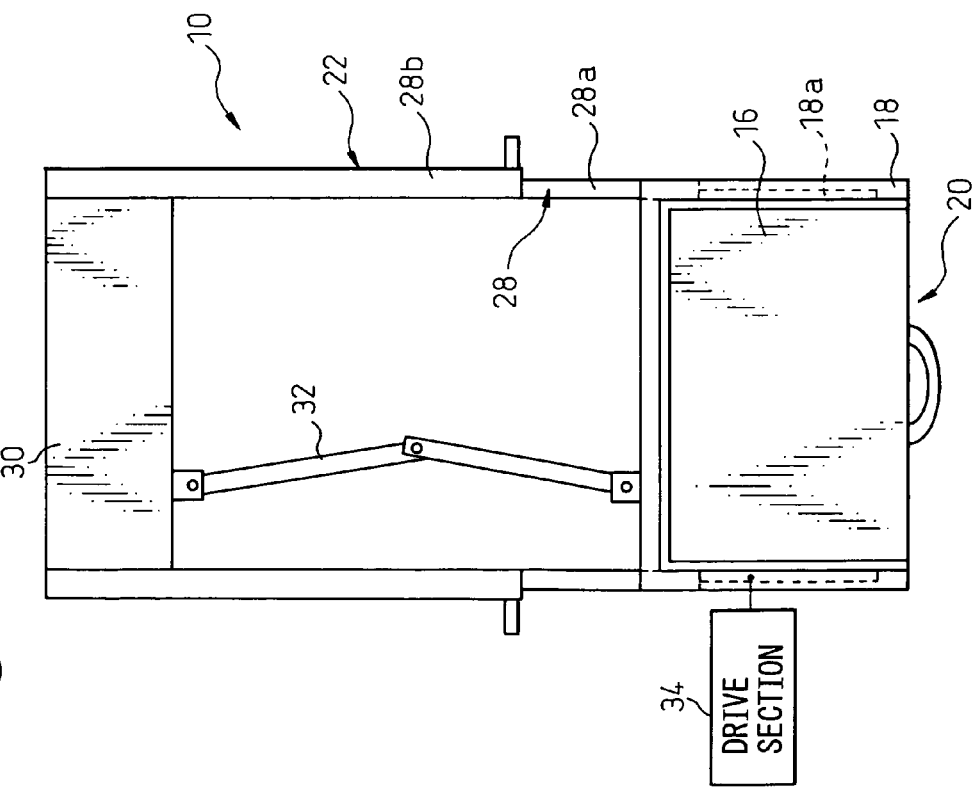

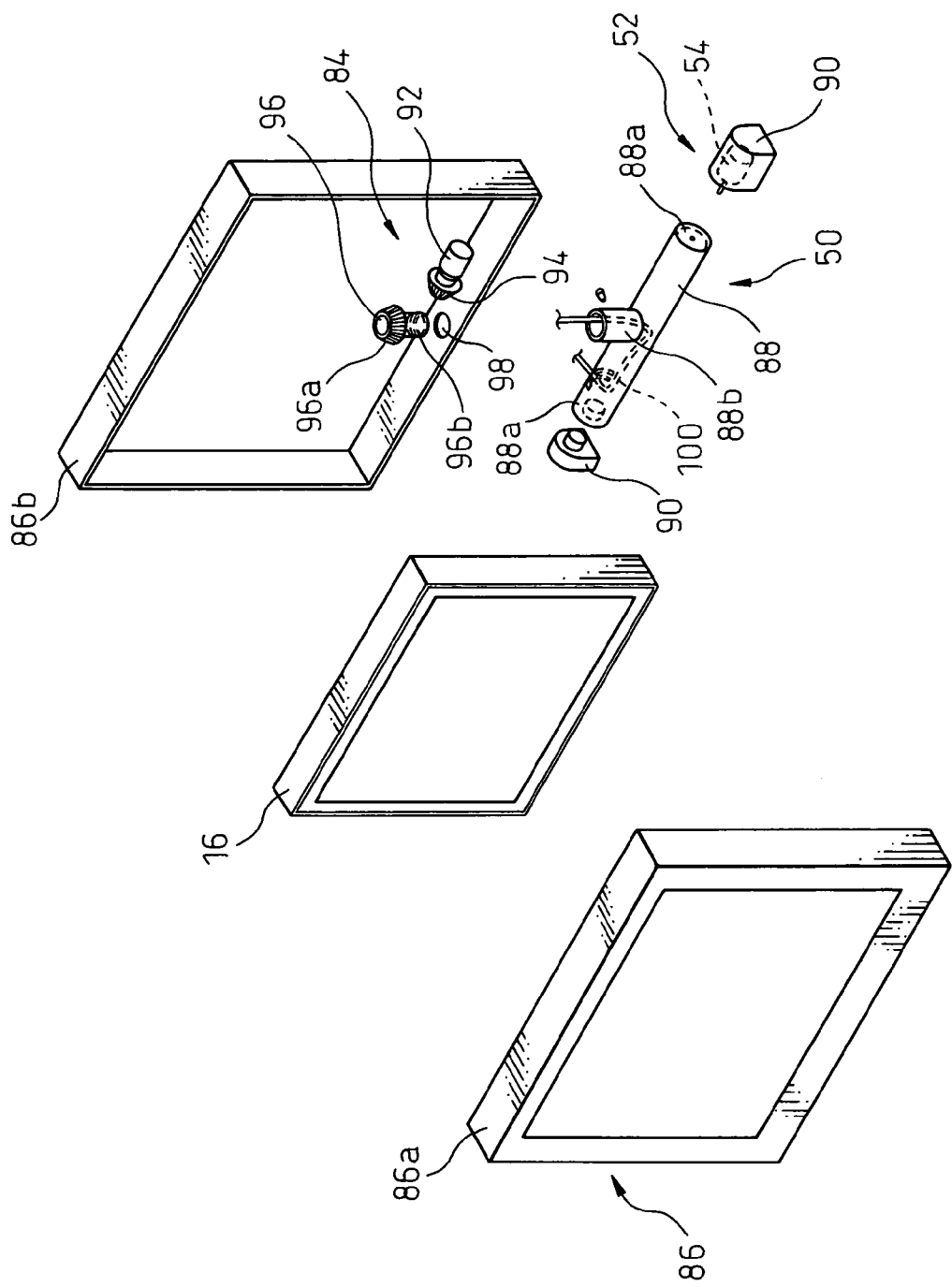

MOVABLE CONSOLE DEVICE

BACKGROUND OF THE INVENTION

1. Field of the Invention

The present invention relates to a movable console device having a rack-mount configuration.

2. Description of the Related Art

In recent years, various electronic devices, such as computers, designed to be mounted for use on a rack having predetermined mounting dimensions, have been developed as rack-mount type electronic devices having superior space-saving features. In the rack-mount type electronic devices, there is known a movable console device (or a so-called console drawer) provided with a console section including a keyboard (or an input unit) and a display (or an output unit), and a mount section for mounting the console section in a linearly movable manner onto a rack structure provided separately, wherein the movable console device can be taken in and out of the rack structure in a drawer-like manner (for example, see Japanese Unexamined Patent Publication (Kokai) No. 2000-29565 (JP-A-2000-29565)).

In the movable console device described in JP-A-2000-29565, the console section includes receiving portions, defined inside a frame member (referred to as "a module" in JP-A-2000-29565) having predetermined dimensions, for individually receiving a keyboard and a display. The keyboard is fixedly placed on the frame member at a front side (i.e., a near side relative to, or as seen by, an operator) with the operating surface of the keyboard, on which a plurality of keys are arranged, being exposed. The display is placed on the frame member at a rear side (i.e., a far side relative to, or as seen by, an operator) and is rotatably mounted onto the frame member through a pivotal support mechanism such as a hinge. When the movable console device is not used, the display is accommodated in a receiving portion therefor in a flat or horizontal attitude with the screen surface of the display facing upward, and the screen surface is placed at substantially the same height as the operating surface of the keyboard. In this state, the console section exhibits a plate-like profile having a predetermined dimension as a whole, defined by the outer dimension of the frame member, and is contained in or inserted into the rack structure through the mount section. On the other hand, when the movable console device is used, the console section is drawn out of the rack structure through the mount section, and the display is rotated relative to the frame member, so as to extend outside the receiving portion, and is disposed at an operating position in which the screen surface of the display faces an operator at an appropriate angle.

JP-A-2000-29565 also discloses another movable console device configured so that, when the movable console device is not used, the display is laid on the keyboard with the screen surface of the display facing the operating surface of the keyboard. In this configuration, the height of the plate-like profile exhibited by the console section in the non-operating state is twice as large as that in the above-described configuration in which the keyboard and the display are arranged side by side in the non-operating state. In this connection, in the technical field of the rack-mount type electronic devices, the height dimension of the electronic devices to be contained in the rack structure has been standardized in such a manner that, for example, the height of a unit shelf zone in a so-called "19-inch width" rack structure is indicated as "1U (=44.45 mm)" (according to the EIA (Electronic Industries Association)). Further, as an improvement of the above configuration in which the keyboard and the display are disposed in a stacked manner in the non-operating state, a movable console device including a thinner console section able to be contained in the shelf zone of the standard unit height (1U) has been also developed.

As described above, in the conventional movable console device, the console section mounted onto the rack structure through the mount section is typically moved by linear translation, to be taken in or out of the rack structure, by a manual operation between a predetermined retracted position in which the console section is completely accommodated inside the rack structure and a predetermined drawn-out position in which the console section is sufficiently drawn out from the rack structure. Also, on the console section located at the drawn-out position, the display is typically displaced for rotation, to open or close a screen thereof, by a manual operation between a non-operating position in which the display is received in the receiving portion and an operating position in which the display extends from the receiving portion. These manual operations are labor-intensive for an operator and impose various burdens depending on the age, the gender, the physical functions, etc. of the operator. Further, the operating position of the display is typically set at a single position on the console section and, therefore, visibility may significantly vary depending on the viewing angle for observing the display.

SUMMARY OF THE INVENTION

It is an object of the present invention to provide a movable console device, having a rack-mount configuration, which can reduce an operator's labor for operating a console section to be taken in or out of a rack structure, and thus can be easily operated regardless of the age, the gender, the physical functions, etc. of the operator.

It is another object of the present invention to provide a movable console device, having a rack-mount configuration, which can reduce an operator's labor for operating a display to be opened or closed on a console section, and thus can be easily operated regardless of the age, the gender, the physical functions, etc. of the operator.

It is a further object of the present invention to provide a movable console device, having a rack-mount configuration, in which the visibility of a display located at an operating position on a console section is improved.

In order to accomplish the above objects, the present invention provides a movable console device having a rack-mount configuration, comprising a console section including a keyboard and a display; a mount section for mounting the console section onto a rack structure in a manner movable between a retracted position and a drawn-out position; and a drive section for automatically moving the console section with respect to the rack structure between the retracted position and the drawn-out position.

The above-described movable console device may be configured such that the mount section mounts the keyboard and the display in the console section onto the rack structure in an individually movable manner, between the retracted position and the drawn-out position, and the drive section automatically moves at least one of the keyboard and the display between the retracted position and the drawn-out position.

Also, the drive section may include a detecting section for detecting obstruction to the movement of the console section and generating a detection signal during a driving operation for moving the console section between the retracted position and the drawn-out position, and a control section for controlling the movement of the console section based on the detection signal.

Also, the console section may include a display support mechanism for supporting the display in a manner displaceable between a non-operating position and an operating position, and the movable console device may further comprise a second drive section for automatically displacing the display between the non-operating position and the operating position.

In this arrangement, the display support mechanism may be configured to support the display located at the operating position in a manner rotatable in a direction different from a displacement direction between the non-operating position and the operating position, and the movable console device may further comprise a third drive section for automatically rotating the display at the operating position.

BRIEF DESCRIPTION OF THE DRAWINGS

The above and other objects, features and advantages of the present invention will become more apparent from the following description of preferred embodiments in connection with the accompanying drawings, wherein:

FIG. 2A is a plan view showing the movable console device of FIG. 1A but arranged at a drawn-out position;

FIG. 2B is a perspective view showing the drawn-out movable console device of FIG. 2A mounted onto a rack structure;

FIG. 14 is an exploded perspective view explicitly showing the third drive section of FIG. 13;

DESCRIPTION OF THE PREFERRED EMBODIMENT

Figure 1A:
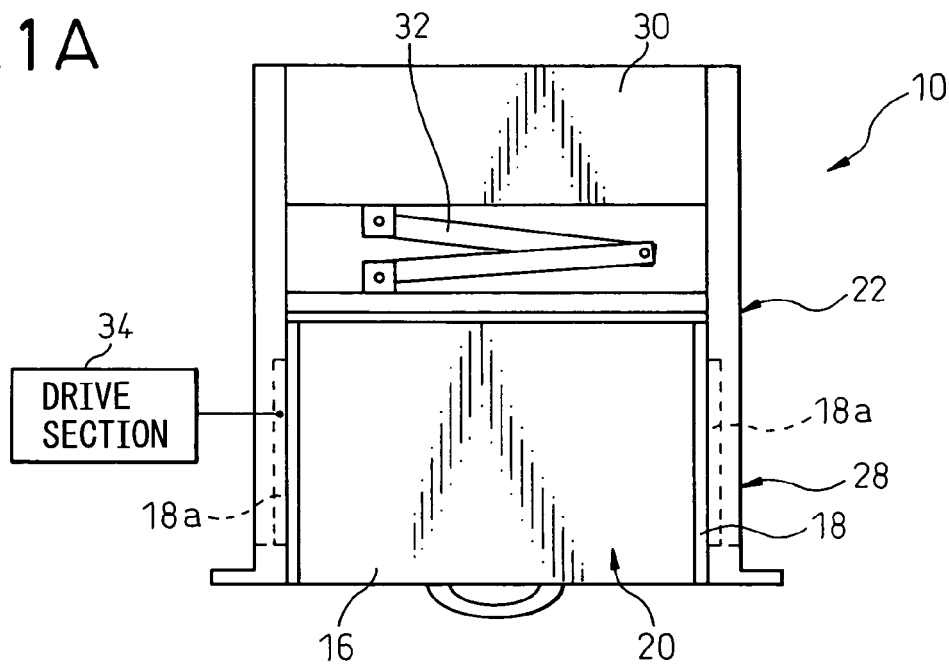
FIG. 1A is a plan view showing a movable console device, according to an embodiment of the present invention, arranged at a retracted position.
Figure 1B:
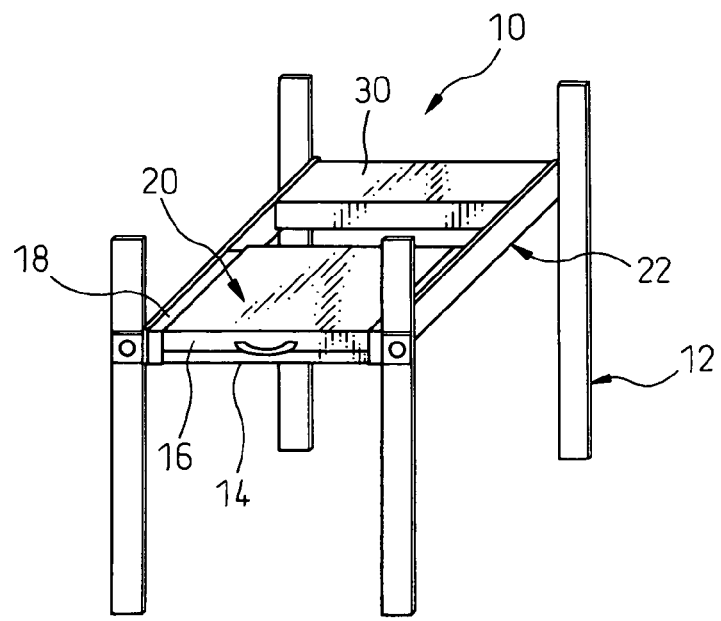
FIG. 1B is a perspective view showing the retracted movable console device of FIG. 1A mounted onto a rack structure.

The embodiments of the present invention are described below, and in detail, with reference to the accompanying drawings. In the drawings, the same or similar components are denoted by common reference numerals.

Referring to the drawings, FIGS. 1A to 3B show a movable console device according to an embodiment of the present invention in various possible positions, as an independent apparatus or mounted onto a rack structure 12.

The movable console device 10 is provided with a console section 20 constituted by incorporating a keyboard (or an input unit) 14 and a display (or an output unit) 16 into a common frame member 18, and a mount section 22 for mounting the console section 20 in a linearly movable manner onto a rack structure 12 provided separately (only four columns of the rack structure 12 are shown in the drawings). The movable console device 10 can be mounted onto the rack structure 12 having predetermined mounting dimensions (e.g., a so-called "19-inch width"), through the mount section 22 at a desired height position, and, in this state, can be taken in and out of the rack structure 12 in a drawer-like manner (FIGS. 1A to 2B).

Figure 3A:
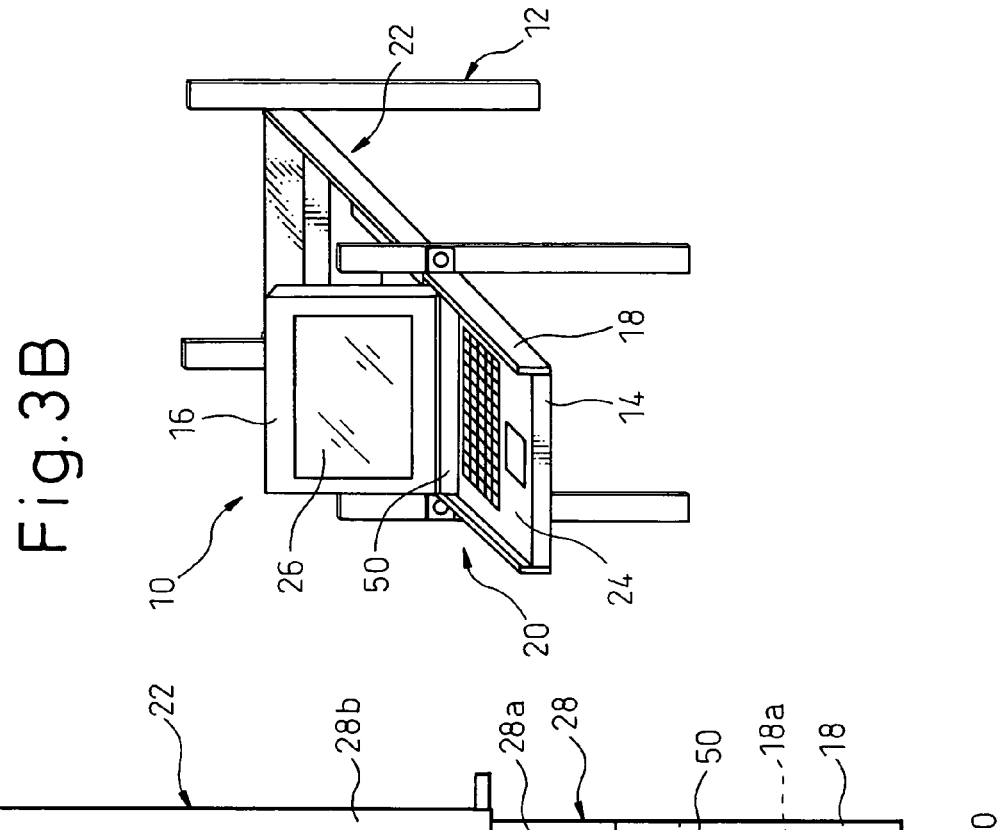
FIG. 3A is a plan view showing the movable console device of FIG. 1A but arranged at a display-operating position.
Figure 3B:
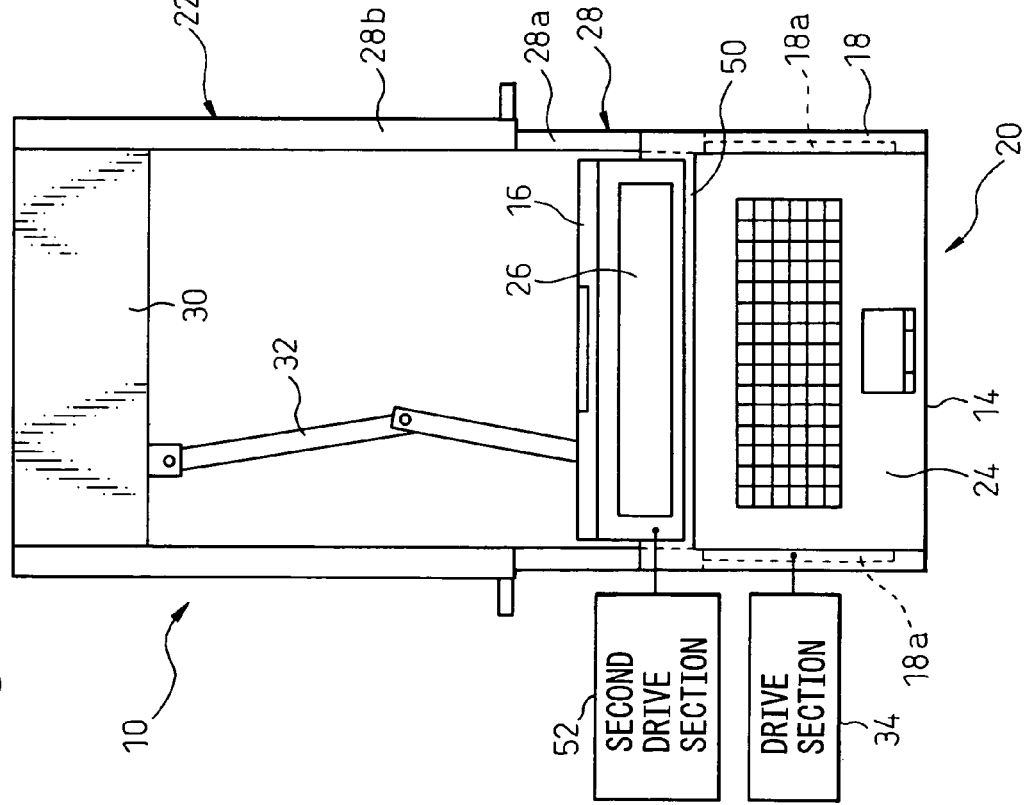
FIG. 3B is a perspective view showing the display-operable movable console device of FIG. 3A mounted onto a rack structure.

The console section 20 has, for example, a thin structure capable of being contained in a shelf zone of a standard unit height (1U=44.45 mm) defined on the rack structure 12. The keyboard 14 and the display 16 can be disposed so as to be stacked on each other, in the interior of the frame member 18 having a height of 1U or less. The keyboard 14 has a low-profile structure, and is disposed on a bottom of the frame member 18 while maintaining a horizontal attitude, with an operating surface 24 of the keyboard 14, being exposed upward, has a plurality of keys arranged in a predetermined array (FIGS. 3A and 3B). The display 16 includes a thin display element such as an LCD (liquid crystal display), and is rotatably supported on the frame member 18 at a point adjacent to the far side of the keyboard 14 as seen by an operator.

The frame member 18 includes a pair of side walls 18a extending parallel to each other. The side walls 18a act as base rail panels provided, on the console section 20, for a slide rail mechanism an a component of the mount section 22, as described later.

When the movable console device 10 is not used, the display 16 is disposed at a non-operating position where the display 16 is laid on the keyboard 14 with a screen surface 26 of the display facing to the operating surface 24 of the keyboard 14. On the other hand, when the movable console device 10 is used, the display 16 is rotated from the non-operating position with respect to the keyboard 14 and the frame member 18 so as to extend outside the frame member 18, and is disposed at an operating position where the screen surface 26 of the display 16 faces an operator at an appropriate angle. In this state, the operating surface 24 of the keyboard 14 is available (FIGS. 3A and 3B). In this connection, in order to allow such an opening/closing operation of the display 16 between the non-operating position and the operating position, a display support mechanism (described later) including a hinge, a support pin, etc. is provided between the display 16 and the frame member 18. Further, the console section 20 may be provided with latch mechanisms (not shown) for respectively anchoring the display 16 at the non-operating position and the operating position.

The mount section 22 includes a pair of slide rail mechanisms 28 that are mounted onto the respective side walls 18a of the frame member 18. Each of the slide rail mechanisms 28 is composed of a plurality of rails slidable relative to each other in a telescopic manner. The slide rail mechanisms 28 are arranged to extend parallel to each other, with the side walls 18a of the frame member 18 of the console section 20 being used as the respective innermost base rail panels of the mechanisms 28, and the intermediate rails 28a and the outermost rails 28b, of the respective mechanisms 28, are able to extend and contract with respect to the console section 20 over a predetermined distance range (FIG. 2A). The outermost rail 28b of each slide rail mechanism 28 is fastened to the rack structure 12. In this connection, the mount section 22 may include latch mechanisms (not shown) for anchoring each slide rail mechanism 28 at the most contracted position (i.e., a position where the console section 20 is fully retracted) and at the most extended position (i.e., a position where the console section 20 is fully drawn out).

The movable console device 10 may optionally include an auxiliary functional section 30 that is functionally independent of the console section 20 and carried on the mount section 22. The auxiliary functional section 30 may contain, for example, a power supply circuits (not shown), a switching device (not shown) for switchably connecting the keyboard 14 and the display 16 of the console section 20 to a plurality of electronic devices (a server and the like; not shown) mounted on the rack structure 12 as a multi-layer stacking system, and so on. In this arrangement, as illustrated, a foldable cable holder 32 is provided between the console section 20 and the auxiliary functional section 30 for holding power and signal cables (not shown) laid therebetween and guiding the cables in a certain wiring direction (the holder 32 is omitted in FIGS. 1B, 2B and 3B).

As described above, the movable console device 10 is mounted, onto the rack structure 12 which stands upright on a certain rack-mounting floor surface, horizontally at a desired height position through the mount section 22. In this mounting position, the console section 20 can linearly reciprocate in a horizontal direction between a predetermined retracted position where the console section 20 is entirely accommodated inside the rack structure 12 (FIGS. 1A and 1B) and a predetermined drawn-out position where the console section 20 is sufficiently drawn out from the rack structure (FIGS. 2A and 2B). Further, the movable console device 10 is characterized by the provision of a drive section 34 for automatically moving the console section 20 with respect to the rack structure 12 between the retracted position (FIGS. 1A and 1B) and the drawn-out position (FIGS. 2A and 2B).

Figure 4:
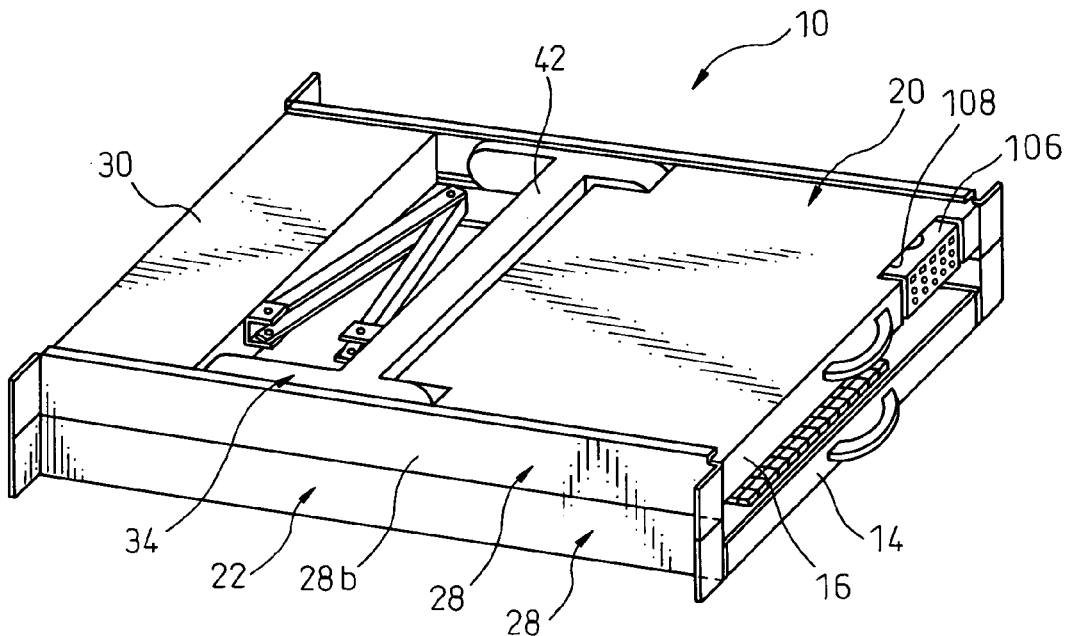
FIG. 4 is a perspective view showing a movable console device, according to another embodiment of the present invention, arranged at a retracted position.
Figure 5:
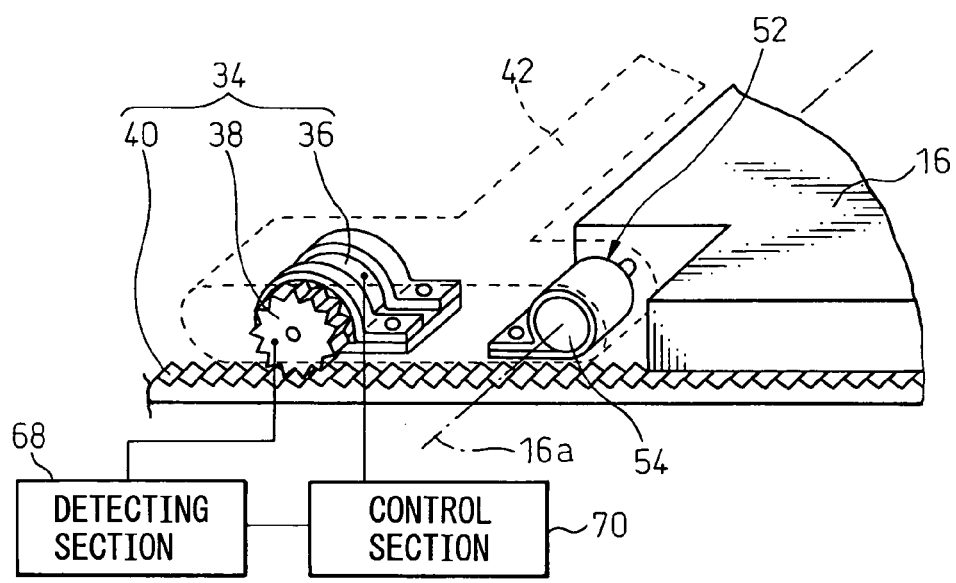
FIG. 5 is a perspective view schematically showing first and second drive sections in the movable console devices of FIGS. 1 and 4.

As shown in FIGS. 4 and 5, the drive section 34 includes an electric motor 36 as a drive source provided in the console section 20, a pinion 38 fixed to an output shaft of the electric motor 36, and a rack 40 provided in the mount section 22 and meshed with the pinion 38. The electric motor 36 is fixedly housed in a casing 42 provided adjacent to the far side of the console section 20 as seen from the operator. The casing 42 is joined to the console section 20 through a display support mechanism (described later) and, therefore, the electric motor 36 can be shifted, together with the casing 42, along the mount section 22 in a manner integral with the console section 20. On the other hand, the rack 40 is fixed to the outermost rail 28b of the slide rail mechanism 28 of the mount section 22.

In the above configuration, when the electric motor 36 is activated, the torque thereof is transmitted to the rack 40 through the pinion 38, so that the electric motor 36 is shifted, together with the casing 42, linearly along the slide rail mechanism 28 of the mount section 22. Then, the linear shifting force is transmitted to the console section 20 through the casing 42 and, as a result, the console section 20 linearly moves on the rack structure 12 while being accompanied by the extending/contracting operation of the slide rail mechanisms 28 as described above (FIGS. 1A to 3B).

The above-described components of the drive section 34 are preferably provided in association with at least one of the pair of slide rail mechanisms 28. For example, a single electric motor 36 may be provided as a drive source, and racks 40 and pinions 38 may be provided in association with both of the pair of slide rail mechanisms 28, through a reduction gear mechanism or a shaft (not shown). According to this configuration, the console section 20 can be smoothly moved, in a parallel motion, along the slide rail mechanisms 28.

According to the movable console device 10 configured as described above, the drive section 34 acts to automatically move the console section 20 between the retracted position and the drawn-out position, so that it becomes possible to significantly redeuce an operator's labor for operating the console section 20 to be taken in or out of the rack structure 12. Therefore, it is possible to easily and accurately operate the movable console device 10 regardless of the age, the gender, the physical functions, etc. of the operator.

In the movable console device 10, as shown in FIG. 4, the mount section 22 may act to mount the keyboard 14 and the display 16 in the console section 20 onto the rack structure 12 in a manner that the keyboard 14 and the display 16 are movable individually and independently from each other between the retracted position (FIGS. 1A and 1B) and the drawn-out position (FIGS. 2A and 2B). In this arrangement, the slide rail mechanisms 28 are provided for each of the keyboard 14 and the display 16. For this configuration, the drive section 34 may be configured to automatically move at least one of the keyboard 14 and the display 16 between the retracted position and the drawn-out position. Although FIG. 5 shows a configuration of the drive section 34 for driving the display 16, a drive section 34 having a similar configuration may be provided for the keyboard 14.

According to the above configuration, in a case where it is desired to use either one of the keyboard 14 or the display 16, the keyboard 14 or the display 16 that is not used may remain accommodated inside the rack structure 12. Moreover, it is possible to quickly and accurately take at least one of the keyboard 14 and the display 16, provided with the drive section 34, in or out of the rack structure 12.

Figure 6:
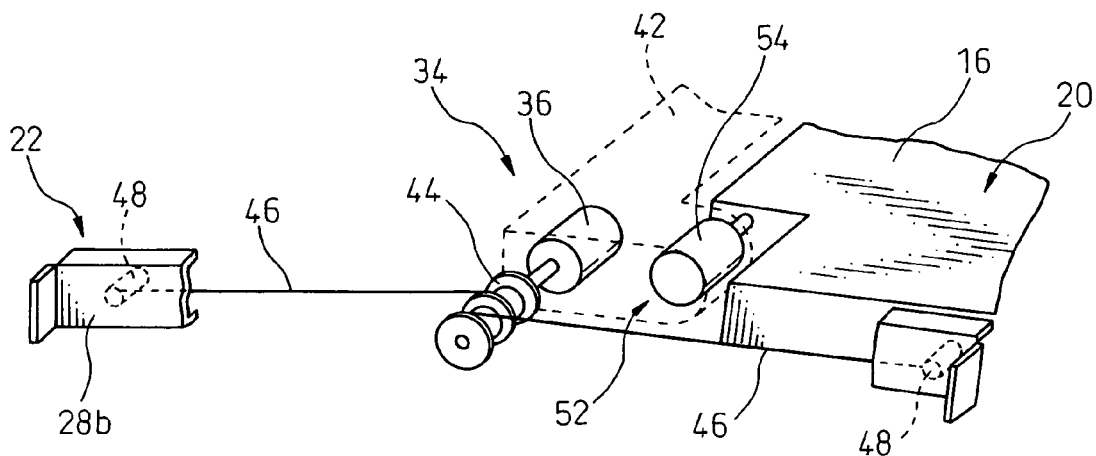
FIG. 6 is a perspective view schematically showing a modification of the first drive section.

The drive section 34 may be configured differently. For example, as shown in FIG. 6, the drive section 34 may include an electric motor 36 fixedly housed in a casing 42, a wind-up roller 44 fixed to an output shaft of the electric motor 36, and a wire 46 laid between the wind-up roller 44 and the mount section 22. In the illustrated example, the outermost rail 28b of the slide rail mechanism 28 is provided at opposite longitudinal ends thereof with fixed pins 48, and a pair of wires 46 adapted to be wound, from the first ends thereof, around the wind-up roller 44 are secured at the second ends thereof to the respective fixed pins 48.

In this configuration, when the electric motor 36 is activated, either one of the first or second wire 46 is wound around the wind-up roller 44, depending on the rotational direction of the electric motor 36, so that the electric motor 36 is linearly shifted, together with the casing 42, along the slide rail mechanism 28 of the mount section 22. Then, the linear shifting force is transmitted to the console section 20 through the casing 42 and, as a result, the console section 20 linearly moves on the rack structure 12 while being accompanied by the extending/contracting operation of the slide rail mechanisms 28 as described above (FIGS. 1A to 3B). In the drive section 34 configured as described above, wires 46 may also be provided in association with both of the pair of slide rail mechanisms 28.

In the movable console device 10, the console section 20 is provided with a display support mechanism 50 for supporting the display 16 in a manner displaceable between the non-operating and operating positions (FIGS. 3A and 3B). The display support mechanism 50 includes a hinge and/or a support pin (not shown), and supports the display 16 relative to the frame member 18 in a manner rotatable to be opened or closed about a predetermined axis between the non-operating position and the operating position. For this configuration, the movable console device 10 may include a second drive section 52 for automatically displacing the display 16 between the non-operating position and the operating position.

Figure 7:
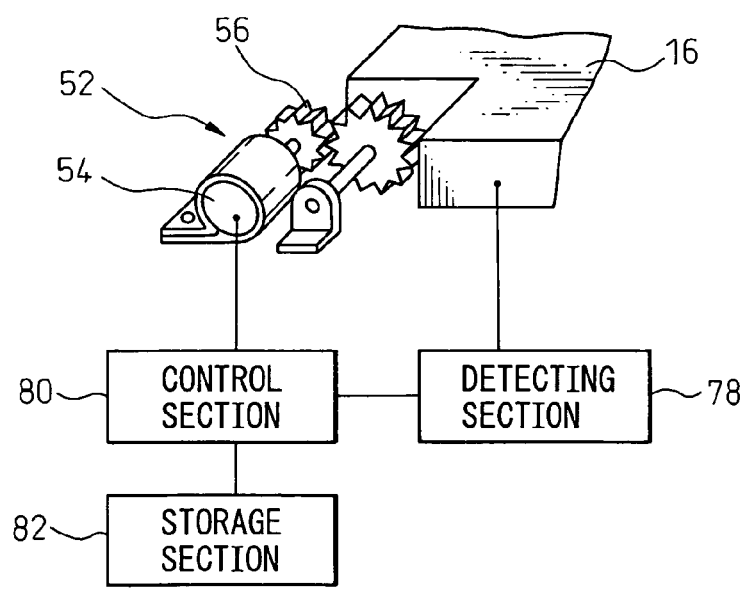
FIG. 7 is a perspective view schematically showing a modification of the second drive section.

As shown in FIGS. 5 and 6, the second drive section 52 includes a second electric motor 54 as a drive source provided in the console section 20. Similar to the electric motor 36, in the drive section 34 as described above, the electric motor 54 is fixedly housed in the casing 42 provided adjacent to the far side of the console section 20 as seen from the operator. The output shaft of the electric motor 54 is directly joined to a bottom region of the display 16, adjacent to the far side of the keyboard 14 as seen from the operator. Alternatively, as shown in FIG. 7, the output shaft of the electric motor 54 may be joined to the display 16 through a gear train 56.

In the above configuration, when the electric motor 54 is activated, the torque thereof is transmitted to the display 16, so that the display 16 is displaced for rotation about an axis 16a (FIG. 5). As a result, the display 16 operates to open or close between the non-operating position (FIGS. 2A and 2B) and the operating position (FIGS. 3A and 3B).

The above-described components of the second drive section 52 are preferably provided in association with at least one of a pair of lateral faces of the display 16. For example, a single electric motor 54 may be provided as a drive source, so as to apply a torque about the rotation axis 16a on both of the lateral faces of the display 16, through a reduction gear mechanism or a shaft (not shown). According to this configuration, the display 16 is able to be smoothly displaced, for an opening or closing motion, without being subjected generally to a twisting force.

According to the movable console device 10 configured as described above, the second drive section 52 acts to automatically displace the display 16 between the non-operating position and the operating position, so that it becomes possible to significantly relieve an operator's labor for operating the display 16 to be opened or closed on the console section 20. Therefore, it is possible to easily and accurately operate the movable console device 10 regardless of the age, the gender, the physical functions, etc. of the operator.

Figure 8A:
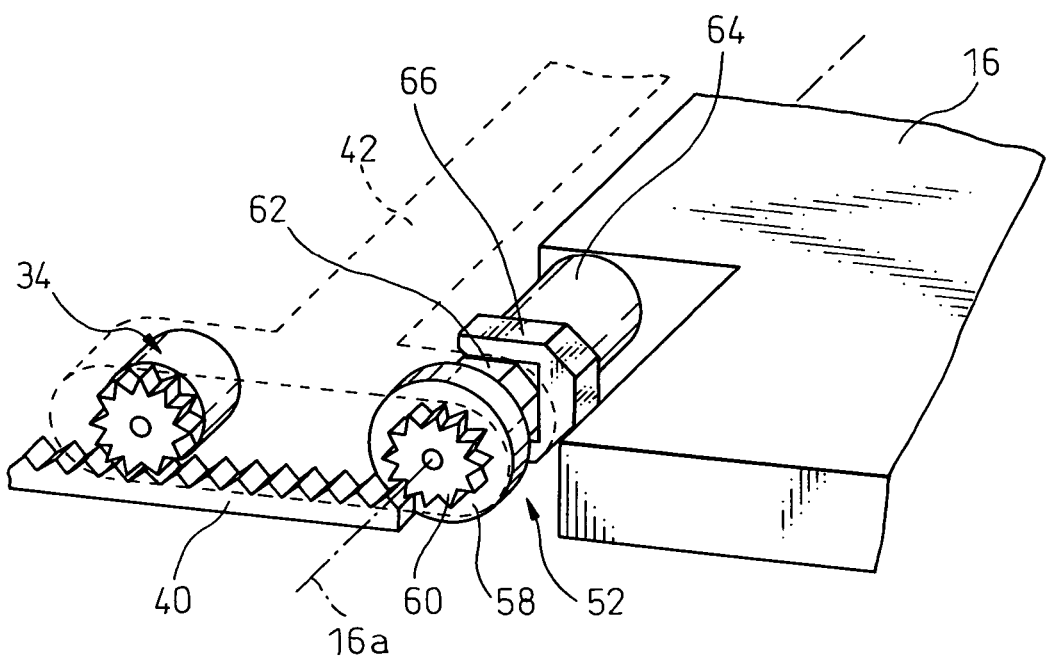
FIG. 8A is a perspective view showing an entire configuration of another modification of the second drive section.
Figure 8B:
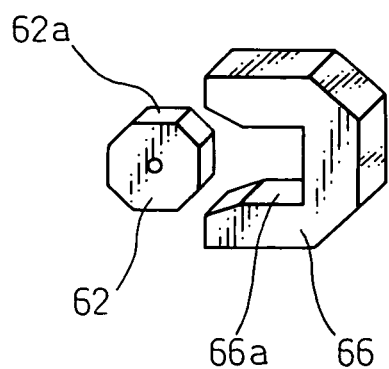
FIG. 8B is an enlarged view of a shaft portion in the second drive section of FIG. 8A.

The second drive section 52 may be configured differently. For example, as shown in FIGS. 8A and 8B, the second drive section 52 may have a power spring unit 58 as a drive source. In this arrangement, the power spring unit 58 includes a follower gear 60 meshable with the rack 40 of the drive section 34 and a power spring shaft 62 connected to the follower gear 60 through a one-way clutch (not shown), and is fixedly arranged in the casing 42 (FIG. 8A). The spring shaft 62 is provided with an outer circumferential surface 62a having a polygonal profile (FIG. 8B), and rotates, accompanying with the reverse rotation of the follower gear 60, due to the elastic restoration of a spiral spring (not shown) of the power spring unit, which has been wound up by the normal rotation of the follower gear 60. On the other hand, the display 16 is provided with a shaft part 64, the center of which coincides with the axis 16a, and a seat element 66 capable of securely receiving the spring shaft 62 is formed at the distal end of the shaft part 64. The seat element 66 has a hollowed periphery 66a (FIG. 8B) capable of at least partially coming into tight contact with the outer circumferential surface 62a of the spring shaft 62.

In the above configuration, during the movement of the console section 20 from the retracted position (FIGS. 1A and 1B) to the drawn-out position (FIGS. 2A and 2B) due to the driving operation of the drive section 34, the power spring unit 58 stores a spring force with the spiral spring thereof being wound up due to the intermesh between the follower gear 60 and the rack 40. At an instant when the console section 20 reaches the drawn-out position, the power spring unit 58 is in a state where a sufficient spring force is stored, and, in this state, the spring shaft 62 is received in the seat element 66 of the shaft part 64 of the display 16 and simultaneously the follower gear 60 is separated away from the rack 40. In this state, the spring force caused due to the elastic restoration of the power spring unit 58 is transmitted from the spring shaft 62 to the shaft part 64 of the display 16 as a rotational driving force, and thereby the display 16 is automatically displaced from the non-operating position (FIGS. 2A and 2B) to the operating position (FIGS. 3A and 3B).

According to the above-described configuration, where the second drive section 52 obtains a driving force for displacing the display 16 between the non-operating position and the operating position by using the movement of the console section 20 from the retracted position to the drawn-out position, it becomes unnecessary to use an electric motor for the second drive section 52 and, therefore, it is possible to simplify the configuration of the movable console device 10 and to reduce the weight of the latter. It should be noted that, in this configuration, the display 16 can be displaced by a manual operation from the operating position (FIGS. 3A and 3B) to the non-operating position (FIGS. 2A and 2B).

In the movable console device 10, the console take-in/out operation is automated by using the drive section 34, so that, for the sake of safety, it is possible to provide an emergency stop function for the drive section 34. For this arrangement, the drive section 34 may include a detecting section 68 for detecting obstruction to the movement of the console section 20 and generating a detection signal, during a driving operation for moving the console section 20 between the retracted position and the drawn-out position, and a control section 70 for controlling the movement of the console section 20 based on the detection signal (FIG. 5).

Figure 9A:
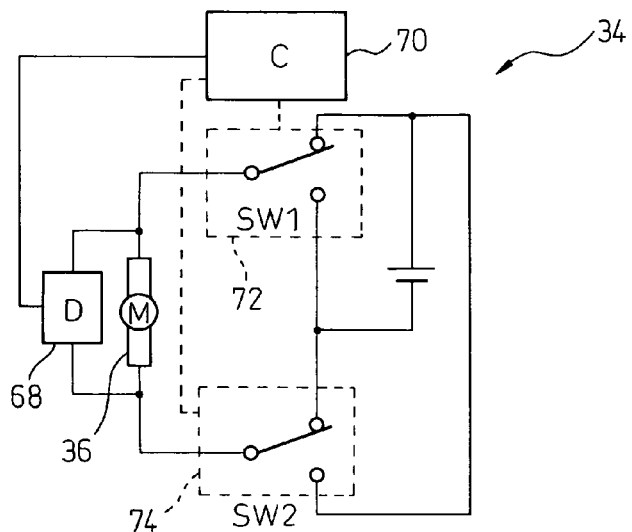
FIGS. 9A to 9C are circuit diagrams representing a safety measure in the drive section, in a motor normal-rotation condition, a motor stop condition and a motor reverse-rotation condition, respectively.
Figure 9B:
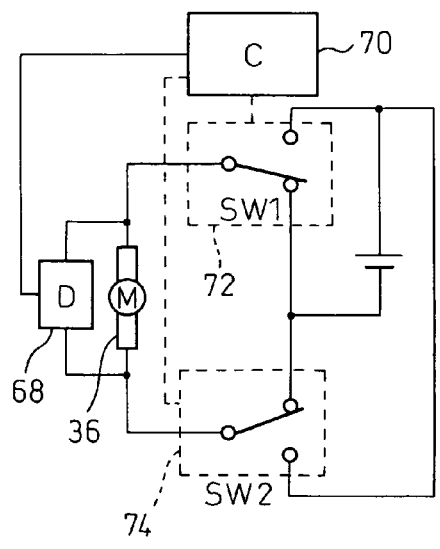
Figure 9C:
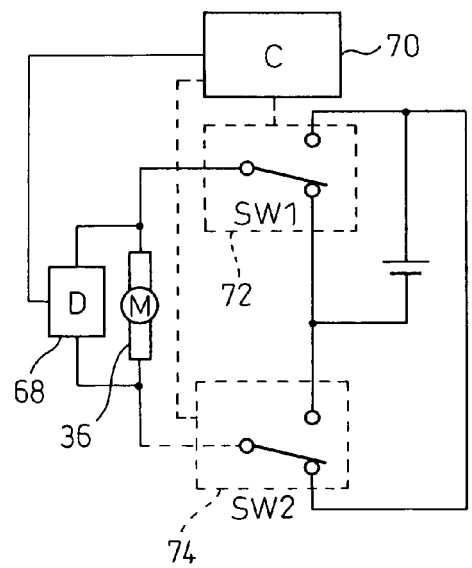

For example, as shown in FIGS. 9A-9C, the drive section 34 may be provided with the detecting section 68 monitoring variation in the load current of the electric motor 36 and the control section 70 controlling the electric motor 36 so as to stop or operate in reverse rotation when the detecting section 68 detects an abnormality in the load current of the electric motor 36. In this configuration, during a condition (FIG. 9A) where the electric motor 36 operates in normal rotation to move the console section 20 from the retracted position (FIGS. 1A and 1B) to the drawn-out position (FIGS. 2A and 2B), if the load current of the electric motor 36 is increased due to, e.g., the collision of the console section 20 against an obstruction, the detecting section 68 outputs a detection signal. Then, based on this detection signal, the control section 70 appropriately controls switches (or relays) 72, 74, shown in an illustrated control circuit, so as to stop the electric motor 36 (FIG. 9B) or operate it in reverse (FIG. 9C).

Figure 10:
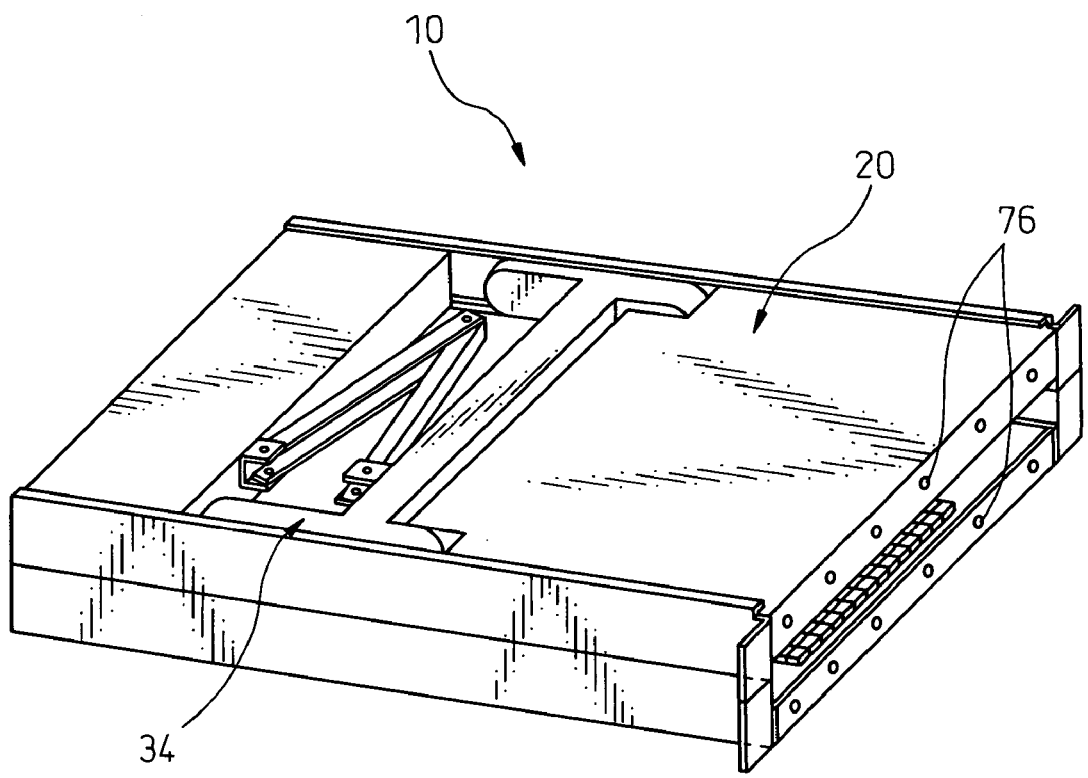
FIG. 10 is a perspective view showing a modification of the safety measure in the drive section.

Alternatively, as shown in FIG. 10, the drive section 34 may be provided with the detecting section 68 having a non-contact feature including, e.g., a reflection optical sensor 76. In the illustrated example, a plurality of reflection optical sensors 76 are provided on the front end surfaces, as seen in a drawn-out direction, of the keyboard 14 and display 16 in the console section 20. Also in this configuration, in a state on where the electric motor 36 (FIG. 5) operates in a normal rotation to move the console section 20 from the retracted position to the drawn-out position, if the non-contact type detecting section 68 (FIG. 5) detects the existence of an obstruction, the control section 70 (FIG. 5) can stop the electric motor 36 or operate it in reverse rotation.

The safety countermeasure described above may be adopted in a configuration such that the display open/close operation is automated by using the second drive section 52. In this arrangement, the second drive section 52 may include a detecting section 78 for detecting obstruction to the displacement of the display 16 and generating a detection signal, during a driving operation for displacing the display 16 between the non-operating position and the operating position, and a control section 80 for controlling the displacement of the display 16 (e.g., the operation of the electric motor 54) based on the detection signal (FIG. 7). In this connection, the detecting section 78 and the control section 80 of the second drive section 52 may be configured similarly to the detecting section 68 and the control section 70 of the drive section 34 described above.

It is advantageous that the second drive section 52 of the movable console device 10 can adjust the operating position (FIG. 3) of the display 16. For example, if the electric motor 54 is used as a drive source for the second drive section 52, it is useful to incorporate a position/speed detector, such as a known encoder, into the electric motor 54, so as to make it possible to execute the position/speed control of the electric motor 54. According to this configuration, the display 16 can be used at a desired rotation angle (or a desired operating position) as commanded by the operator.

Further, in this configuration, it is desirable that the second drive section 52 is provided with a storage section 82 for storing the operating position of the display 16 after it is adjusted (FIG. 7). In this arrangement, it is possible for the above-described control section 80 to control the electric motor 54 on the basis of the operating position stored in the storage section 82, and thereby, once the operator commands a desired operating position, to accurately reproduce the operating position.

Figure 11:
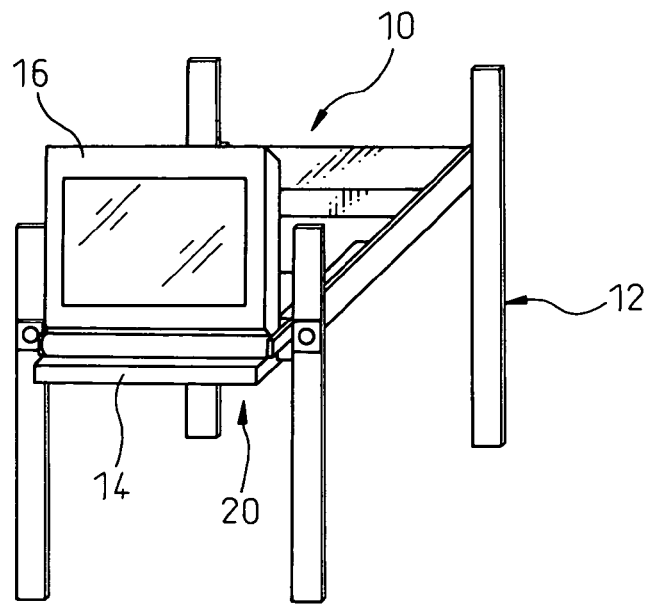
FIG. 11 is a perspective view showing the movable console device of FIG. 4 arranged at a display-operating position and mounted onto a rack structure.
Figure 12:
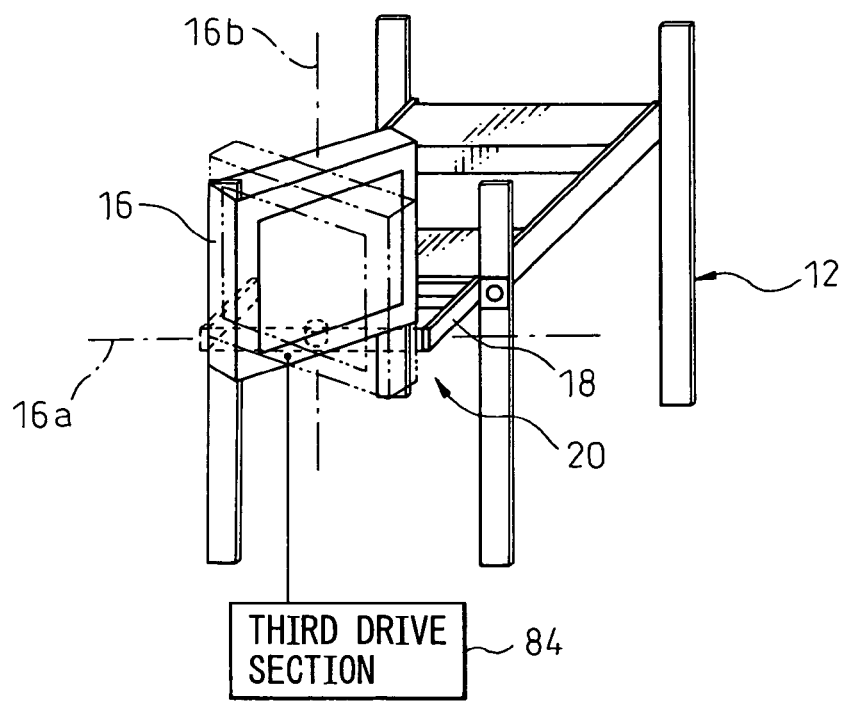
FIG. 12 is a perspective view for explaining a display rotating operation in the movable console device of FIG. 11.

Moreover, in the movable console device 10, the display support mechanism 50 may be configured to support the display 16 located at the operating position in a manner rotatable in a direction different from the displacement direction between the non-operating position and the operating position (FIGS. 2A-3B). In the configuration in which the display 16 can be moved into the drawn-out position independently of the keyboard 14 (see FIG. 11), there is a case where the display 16 disposed at the operating position is required to be observed from various bearings or directions other than the front of the display 16. From this viewpoint, as shown in FIG. 12, it is preferred that the display 16 is rotatable on the frame member 18 about a vertical axis 16b substantially orthogonal to the rotation axis 16a (i.e., the observation angle is adjustable). According to this configuration, the visibility of the display 16 located at the operating position on the console section 20 can be significantly improved.

In the above configuration, it is advantageous to provide a third drive section 84 for automatically rotating the display 16 at the operating position. According to this configuration, it becomes possible to significantly reduce an operator's labor for operating the display 16 to be rotated on the console section 20. Therefore, it is possible to easily and accurately operate the movable console device 10 regardless of the age, the gender, the physical functions, etc. of the operator.

Figure 13:
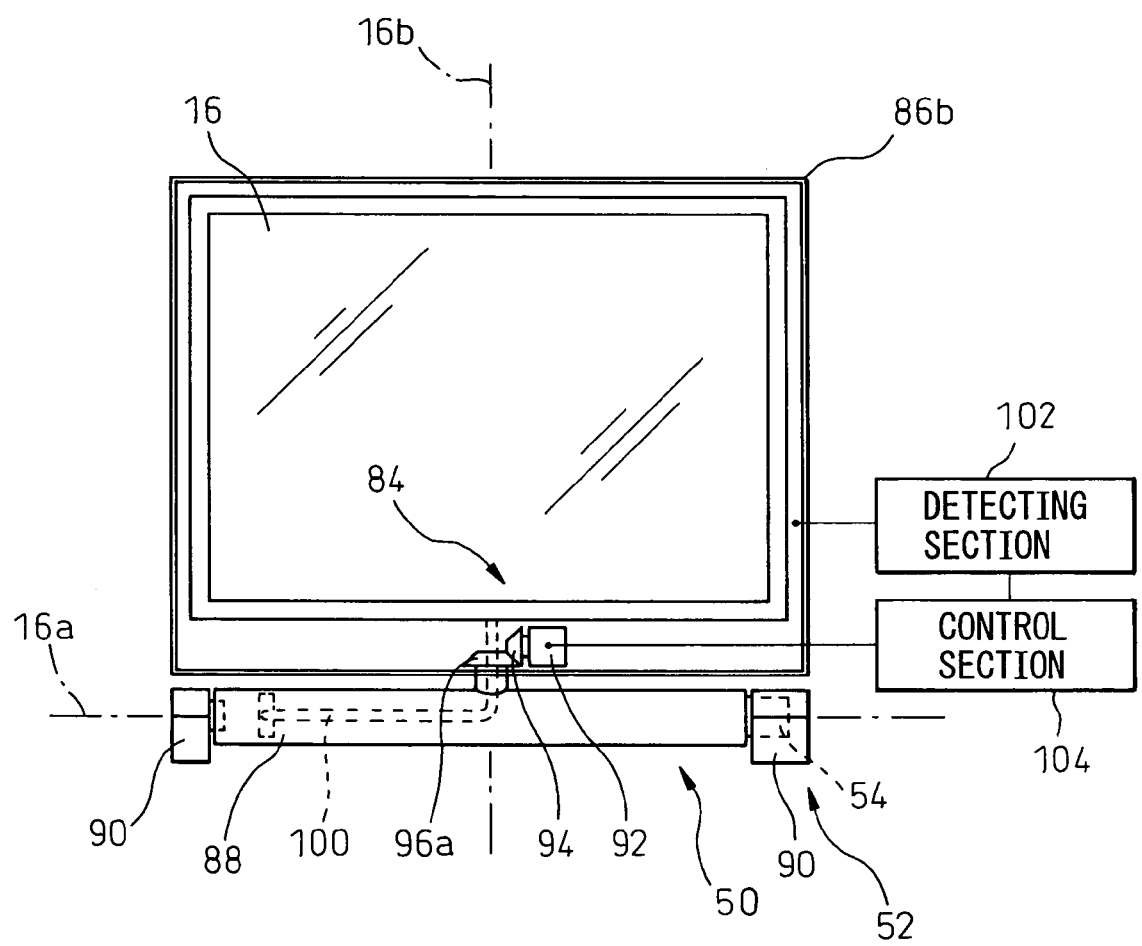
FIG. 13 is a front view showing a third drive section of the movable console device of FIG. 11.

An exemplary configuration of the display support mechanism 50, the second drive section 52 and the third drive section 84 will be described below, with reference to FIGS. 13 and 14.

In the illustrated example, the display 16 is accommodated in a housing 86 having a front cover 86a and a rear cover 86b, and a T-shaped rotary tube 88 is arranged along one edge of the housing 86 to constitute the display support mechanism 50. The rotary tube 88 is rotatably supported at opposite longitudinal ends 88a thereof on a pair of axle members 90 secured to the frame member 18 (FIG. 12), and a branch portion 88b protruding laterally at the longitudinal center of the rotary tube 88 is rotatably joined to the housing 86. The electric motor 54 of the second drive section 52 is housed in one of the axle members 90 and the output shaft of the electric motor 54 is fixedly joined to the rotary tube 88. Therefore, when the electric motor 54 of the second drive section 52 is activated, the rotary tube 88 rotates about the axis 16a together with the housing 86 and the display 16 in an integral manner.

The third drive section 84 includes an electric motor 92, as a drive source, securely housed inside the housing 86, a first bevel gear 94 fixed to an output shaft of the electric motor 92, and a torque transmitting member 96 fixed to the housing 86 and provided at the distal end thereof with a second bevel gear 96a meshable with the first bevel gear 94. The rear cover 86b of the housing 86 is provided with a through-hole 98 formed in one side wall adjacent to the rotary tube 88, and a shaft portion 96b of the torque transmitting member 96 is securely received in the through-hole 98. The torque transfer member 96 is arranged such that the second bevel gear 96a is disposed inside the housing 86, whereas the shaft portion 96b protrudes outside the housing 86 through the through-hole 98 of the rear cover 86b. The shaft portion 96b of the torque transfer member 96 is rotatably and securely received in the branch portion 88b of the rotary tube 88.

In the above configuration, when the electric motor 92 of the third drive section 84 is activated, the torque thereof is transmitted to the housing 86 through the first bevel gear 94 and the torque transmitting member 96, so that the housing 86 is rotated about the axis 16b. As a result, the display 16, located at the operating position, rotates about the axis 16b on the frame member 18 to be disposed at an appropriate observation-angle position. In this connection, it is preferred that the rotary tube 88 and the torque transmitting member 96 have hollow structures allowing power supply and signal cables 100 for the display 16 to be laid therein.

Also in the third drive section 84, a safety measure can be taken which is similar to that in the first and second drive sections 34, 52 described above. For this arrangement, the third drive section 84 may include a detecting section 102 for detecting obstruction to rotation of the display 16 and generating a detection signal, during a driving operation for rotating the display 16 at the operating position, and a control section 104 for controlling the rotation of the display 16 (i.e., the operation of the electric motor 92) based on the detection signal. In this connection, the detecting section 102 and the control section 104 of the third drive section 84 may be configured similarly to the detecting section 68 and the control section 70 of the first drive section 34, respectively. Further, it is advantageous that the third drive section 84 is configured similarly to the second drive section 52 so as to perform the adjustment, storing and reproducing of the rotation angle of the display 16.

The movable console device 10 may further include an operating section 106 for giving a drive command to at least one of the first drive section 34, the second drive section 52 and the third drive section 84. In this arrangement, it is advantageous that the operating section 106 is provided in the console section 20 (FIG. 4). In the illustrated example, the operating section 106 is constructed as a manual input unit, and is detachably mounted in a recess 108 formed at a top edge of the display 16.

Figure 15A:
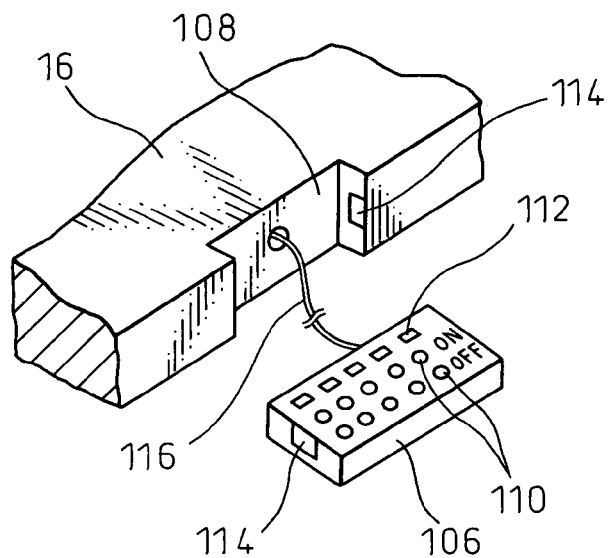
FIG. 15A is a partial enlarged perspective view showing a wired operating section provided in the movable console device of FIG. 4.
Figure 15B:
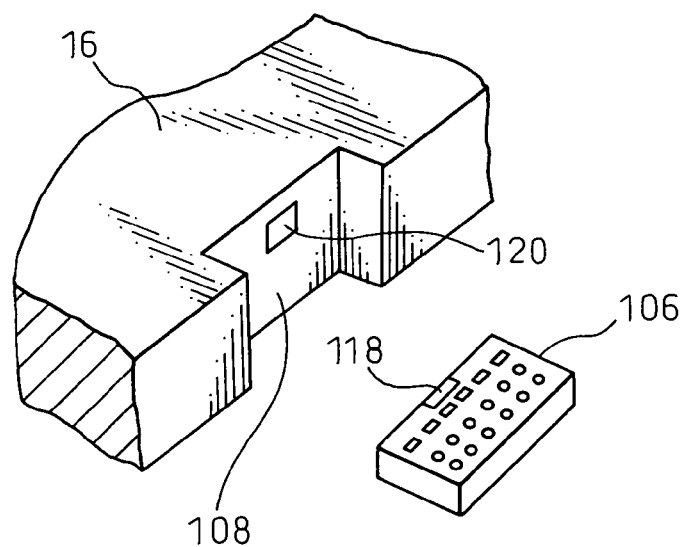
FIG. 15B is a partial enlarged perspective view showing a wireless operating section provided in the movable console device of FIG. 4.

For example, as shown in FIGS. 15A and 15B, the operating section 106 is constructed as a remote control switch, in which on/off switches 110 for respective operation commands, a LED 112 for indicating an operating condition of the device, etc. are arranged in positions allowing easy manipulation and observation. In this arrangement, the operating section 106 may be detachably retained in the recess 108 of the display 16 by a magnet 114 and the like. In this connection, as a signal transmission system for the operating section 106, it is possible to adopt either a wired system using a cable 116, etc. (FIG. 15A) or a wireless system using a light emitter 118 and a light receiver 120 (FIG. 15B).

The above-described movable console device 10 according to an embodiment of the present invention may include all of the first drive section 34 for moving the console section 20 between the retracted position and the drawn-out position, the second drive section 52 for displacing the display 16 between the non-operating position and the operating position, and the third drive section 84 for rotating the display 16 at the operating position. However, the present invention is not limited to this embodiment, and may include at least one of the first to third drive sections 34, 52 and 84 to meet the user's requirements.

While the invention has been described with reference to specific preferred embodiments, it will be understood, by those skilled in the art, that various changes and modifications may be made thereto without departing from the scope of the following claims.

The invention claimed is:

1. A movable console device, having a rack-mount configuration, comprising:
   a console section including a keyboard and a display;
   a mount section for mounting said console section onto a rack structure in a manner movable between a retracted position and a drawn-out position; and
   a drive section for automatically moving said console section with respect to the rack structure between said retracted position and said drawn-out position;
   wherein said drive section includes a detecting section for detecting an existence of an obstruction to a movement of said console section and generating an obstruction detection signal, during a driving operation for moving said console section between said retracted position and said drawn-out position, and a control section for controlling said movement of said console section based on said obstruction detection signal.

2. A movable console device as set forth in claim 1, wherein said mount section mounts said keyboard and said display in said console section onto the rack structure in a manner individually movable between said retracted position and said drawn-out position; and wherein said drive section automatically moves at least one of said keyboard and said display between said retracted position and said drawn-out position.

3. A movable console device as set forth in claim 1, further comprising an operating section for giving a drive command to said drive section, said operating section being provided in said console section.

4. A movable console device as set forth in claim 1, wherein said console section includes a display support mechanism for supporting said display in a manner displaceable between a non-operating position and an operating position; and wherein said movable console device further comprises a second drive section for automatically displacing said display between said non-operating position and said operating position.

5. A movable console device as set forth in claim 4, wherein said second drive section obtains a driving force for displacing said display between said non-operating position and said operating position, depending on said movement of said console section from said retracted position to said drawn-out position.

6. A movable console device as set forth in claim 4, wherein said second drive section acts to adjust said operating position of said display.

7. A movable console device as set forth in claim 6, wherein said second drive section includes a storage section for storing said operating position of said display as adjusted, and a control section for reproducing said operating position as stored.

8. A movable console device as set forth in claim 4, wherein said second drive section includes a detecting section for detecting obstruction to a displacement of said display and generating a detection signal, during a driving operation for displacing said display between said non-operating position and said operating position, and a control section for controlling said displacement of said display based on said detection signal.

9. A movable console device as set forth in claim 4, further comprising an operating section for giving a drive command to said second drive section, said operating section being provided in said console section.

10. A movable console device as set forth in claim 4, wherein said display support mechanism is configured to support said display located at said operating position in a manner rotatable in a direction different from a displacement direction between said non-operating position and said operating position; and wherein said movable console device further comprises a third drive section for automatically rotating said display at said operating position.

11. A movable console device as set forth in claim 10, wherein said third drive section includes a detecting section for detecting obstruction to a rotation of said display and generating a detection signal, during a driving operation for rotating said display at said operating position, and a control section for controlling said rotation of said display based on said detection signal.

12. A movable console device as set forth in claim 10, further comprising an operating section for giving a drive command to said third drive section, said operating section being provided in said console section.

13. A movable console device, having a rack-mount configuration, comprising:
   a console section including a display;
   a mount section for mounting said console section onto a rack structure in a manner movable between a retracted position and a drawn-out position;
   a display support mechanism provided in said console section for supporting said display in a manner displaceable between a non-operating position and an operating position; and a drive section for automatically displacing said display between said non-operating position and said operating position;

wherein said drive section includes a detecting section for detecting an existence of an obstruction to a displacement of said display and generating an obstruction detection signal, during a driving operation for displacing said display between said non-operating position and said operating position, and a control section for controlling said displacement of said display based on said obstruction detection signal.

14. A movable console device, having a rack-mount configuration, comprising:

a console section including a display;

a mount section for mounting said console section onto a rack structure in a manner movable between a retracted position and a drawn-out position;

a display support mechanism provided in said console section for supporting said display in a manner displaceable between a non-operating position and an operating position and supporting said display located at said operating position in a manner rotatable in a direction different from a displacement direction between said non-operating position and said operating position; and a drive section for automatically rotating said display at said operating position.

* * * * *